United States Patent
Sakai et al.

(10) Patent No.: US 12,289,829 B2
(45) Date of Patent: Apr. 29, 2025

(54) PRINTED WIRING BOARD

(71) Applicant: IBIDEN CO., LTD., Gifu (JP)

(72) Inventors: Jun Sakai, Ogaki (JP); Takuya Inishi, Ogaki (JP)

(73) Assignee: IBIDEN CO., LTD., Gifu (JP)

( * ) Notice: Subject to any disclaimer, the term of this patent is extended or adjusted under 35 U.S.C. 154(b) by 119 days.

(21) Appl. No.: 18/173,154

(22) Filed: Feb. 23, 2023

(65) Prior Publication Data
US 2023/0276570 A1    Aug. 31, 2023

(30) Foreign Application Priority Data

Feb. 28, 2022 (JP) ................. 2022-028787
Jan. 6, 2023 (JP) ................. 2023-000806

(51) Int. Cl.
| H05K 1/02 | (2006.01) |
| H05K 1/11 | (2006.01) |
| H05K 3/00 | (2006.01) |
| H05K 3/46 | (2006.01) |

(52) U.S. Cl.
CPC ........... H05K 1/0298 (2013.01); H05K 1/115 (2013.01); H05K 3/0094 (2013.01); H05K 3/4644 (2013.01); H05K 2201/0212 (2013.01); H05K 2203/13 (2013.01)

(58) Field of Classification Search
CPC .... H05K 1/0298; H05K 1/115; H05K 3/0094; H05K 3/4644
See application file for complete search history.

(56) References Cited

U.S. PATENT DOCUMENTS

| 2021/0118787 A1 | 4/2021 | Chen et al. |
| 2022/0046795 A1 | 2/2022 | Ikeda |
| 2022/0071016 A1 | 3/2022 | Hwang et al. |

FOREIGN PATENT DOCUMENTS

| EP | 2 405 725 A1 | 1/2012 |
| EP | 2 981 158 A1 | 2/2016 |
| JP | 2015-126103 A | 7/2015 |

OTHER PUBLICATIONS

Extended European Search Report issued Jul. 28, 2023 in corresponding EP 23158950.8, 8 pages.

*Primary Examiner* — Jeremy C Norris
(74) *Attorney, Agent, or Firm* — Oblon, McClelland, Maier & Neustadt, L.L.P.

(57) ABSTRACT

A printed wiring board includes a first conductor layer, an insulating layer formed on the first conductor layer, a second conductor layer formed on the insulating layer, and a via conductor formed in the insulating layer such that the via conductor is connecting the first and second conductor layers. The insulating layer has opening exposing portion of the first conductor layer such that the via conductor is formed in the opening, the second conductor layer and via conductor are formed such that the second conductor layer and via conductor include a seed layer and an electrolytic plating layer on the seed layer, and the insulating layer includes resin and inorganic particles dispersed in the resin such that the particles include first particles forming inner wall surface in the opening and second particles embedded in the insulating layer and the first particles have shapes different from shapes of the second particles.

20 Claims, 4 Drawing Sheets

PRINTED WIRING BOARD

CROSS-REFERENCE TO RELATED APPLICATIONS

The present application is based upon and claims the benefit of priority to Japanese Patent Applications No. 2022-028787, filed Feb. 28, 2022, and No. 2023-000806, filed Jan. 6, 2023. The entire contents of these applications are incorporated herein by reference.

BACKGROUND OF THE INVENTION

Field of the Invention

The present invention relates to a printed wiring board.

Description of Background Art

Japanese Patent Application Laid-Open Publication No. 2015-126103 describes a printed wiring board having a first conductor layer, an insulating layer formed on the first conductor layer, and a second conductor layer formed on the insulating layer. The insulating layer contains a resin and inorganic particles. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on the resin insulating layer, and a via conductor formed in the resin insulating layer such that the via conductor is connecting the first conductor layer and the second conductor layer. The resin insulating layer has an opening exposing a portion of the first conductor layer such that the via conductor is formed in the opening, the second conductor layer and the via conductor are formed such that the second conductor layer and the via conductor include a seed layer and an electrolytic plating layer formed on the seed layer, and the resin insulating layer includes a resin material and inorganic particles dispersed in the resin material such that the inorganic particles include first inorganic particles forming an inner wall surface in the opening and second inorganic particles embedded in the resin insulating layer and that the first inorganic particles have shapes that are different from shapes of the second inorganic particles.

According to another aspect of the present invention, a method of manufacturing a printed wiring board includes forming a resin insulating layer on a first conductor layer, forming a second conductor layer on the resin insulating layer, and forming a via conductor in the resin insulating layer such that the via conductor is connecting the first conductor layer and the second conductor layer. The forming of the via conductor includes forming an opening in the resin insulating layer such that the opening exposes a portion of the first conductor layer and forming the via conductor the opening, the forming of the second conductor layer and the forming of the via conductor includes forming a seed layer and forming an electrolytic plating layer on the seed layer such that the second conductor layer and the via conductor include the seed layer and the electrolytic plating layer on the seed layer, and the forming of the resin insulating layer includes forming the resin insulating layer comprising a resin material and inorganic particles dispersed in the resin material such that the inorganic particles include first inorganic particles forming an inner wall surface in the opening and second inorganic particles embedded in the resin insulating layer and that the first inorganic particles have shapes that are different from shapes of the second inorganic particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
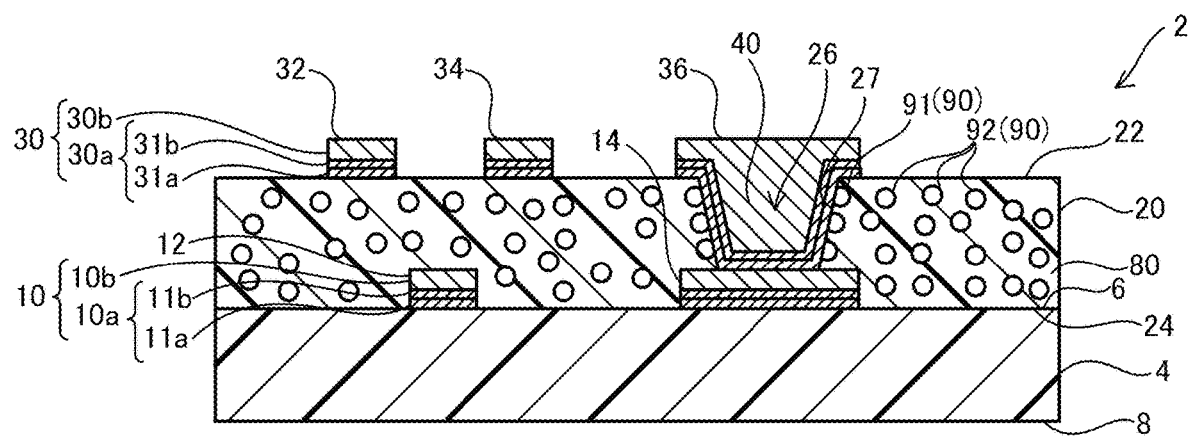
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
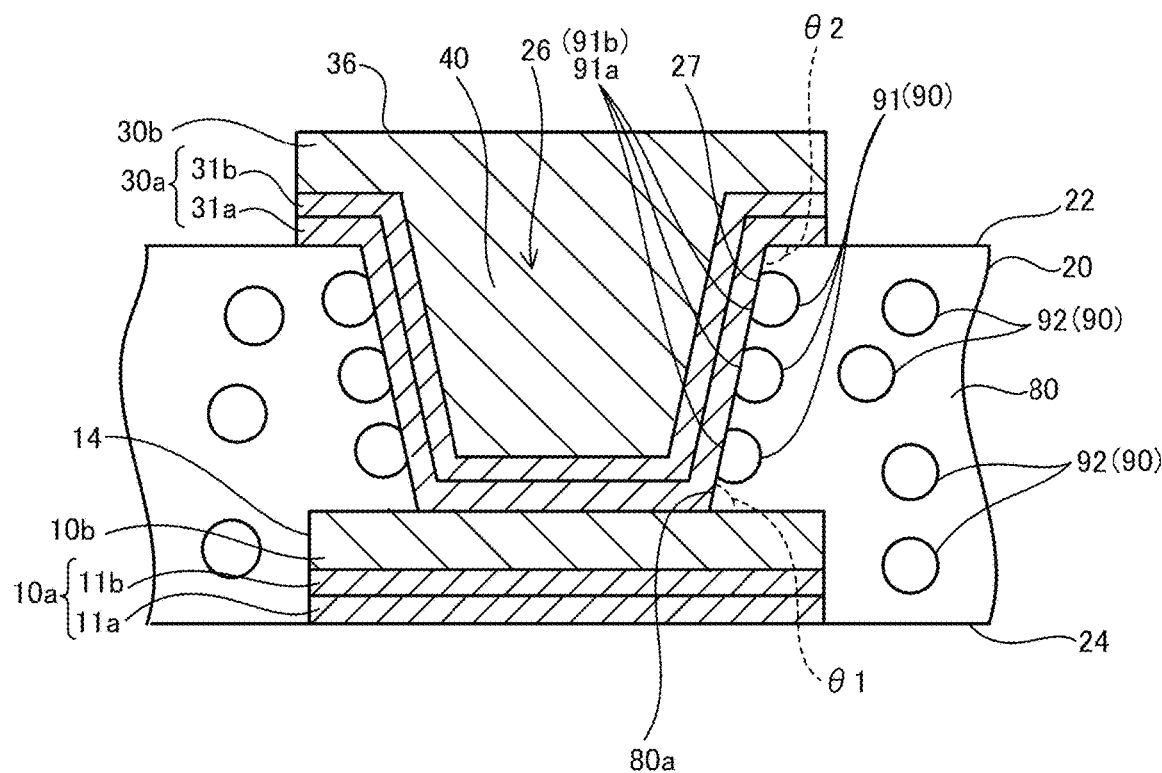
FIG. 2 is an enlarged cross-sectional view schematically illustrating a part of a printed wiring board according to an embodiment of the present invention.

FIG. 1 is a cross-sectional view illustrating a printed wiring board 2 a printed wiring board according to an embodiment of the present invention. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on an opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by a first layer (11a) on the third surface 6 and a second layer (11b) on the first layer (11a). The first layer (11a) is formed of a copper alloy. The second layer (11b) is formed of copper. The electrolytic plating layer (10b) is formed of copper. The first layer (11a) is in contact with the insulating layer 4.

The resin insulating layer 20 is formed on the third surface 6 of the insulating layer 4 and on the first conductor layer 10. The resin insulating layer 20 has a first surface 22 (upper surface in the drawing) and a second surface 24 (lower surface in the drawing) on an opposite side with respect to the first surface 22. The second surface 24 of the resin insulating layer 20 faces the first conductor layer 10. The resin insulating layer 20 has an opening 26 that expose a pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. Examples of the inorganic particles 90 include silica particles and alumina particles.

As illustrated in FIGS. 1 and 2, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

As illustrated in FIG. 1, the first surface 22 of the resin insulating layer 20 is formed of the resin 80 only. The inorganic particles 90 (second inorganic particles 92) are not exposed from the first surface 22. The first surface 22 does not include surfaces of the second inorganic particles 92. No unevenness is formed on the first surface 22 of the resin insulating layer 20. The first surface 22 is not roughened. The first surface 22 is formed smooth.

As illustrated in FIG. 2, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (91a) and a surface of the resin 80 that forms the inner wall surface 27 form substantially a common surface. No unevenness is formed on the resin 80 that forms the inner wall surface 27. The surface of the resin 80 that forms the inner wall surface 27 is smooth. No unevenness is formed on exposed surfaces of the flat parts (91a) (surfaces that form the inner wall surface 27). The exposed surfaces of the flat parts (91a) are smooth. The inner wall surface 27 is formed smooth. The inner wall surface 27 has an arithmetic mean roughness (Ra) of 1.0 μm or less.

The flat parts (91a) of the first inorganic particles 90 substantially match a surface obtained by extending a surface (80a) of the resin 80 formed around the first inorganic particles 91 (a surface that forms the inner wall surface 27).

The flat parts (91a) drawn with substantially straight lines in FIGS. 1 and 2 each mean a flat surface. In the cross sections illustrated in FIGS. 1 and 2, the flat parts (91a) are each a flat surface. It is also possible that the flat parts (91a) are not each a perfect flat surface. The flat parts (91a) are each substantially a flat surface and are each substantially a smooth surface.

As illustrated in FIG. 2, the inner wall surface 27 of the opening 26 is inclined. An angle (inclination angle) ($\theta 1$) between an upper surface of the pad 14 and the inner wall surface 27 is 70 degrees or more and 85 degrees or less. The upper surface of pad 14 is included in an upper surface of first conductor layer 10. An angle (inclination angle) ($\theta 2$) between the first surface (upper surface) 22 of the resin insulating layer 20 and the inner wall surface 27 is 95 degrees or more and 110 degrees or less.

In the cross-sections illustrated in FIGS. 1 and 2, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by a first layer (31a) on the first surface 22 and a second layer (31b) on the first layer (31a). The first layer (31a) is formed of a copper alloy. The second layer (31b) is formed of copper. The electrolytic plating layer (30b) is formed of copper. The first layer (31a) is in contact with the first surface 22.

The via conductor 40 is formed in the opening 26. The via conductor 40 connects the first conductor layer 10 and the second conductor layer 30. In FIG. 1, the via conductor 40 connects the pad 14 and the land 36. The via conductor 40 is formed of a seed layer (30a) and an electrolytic plating layer (30b) on the seed layer (30a). The seed layer (30a) forming the via conductor 40 and the seed layer (30a) forming the second conductor layer 30 are the same. The first layer (31a) is in contact with the inner wall surface 27.

Method for Manufacturing Printed Wiring Board

Figure 3A:
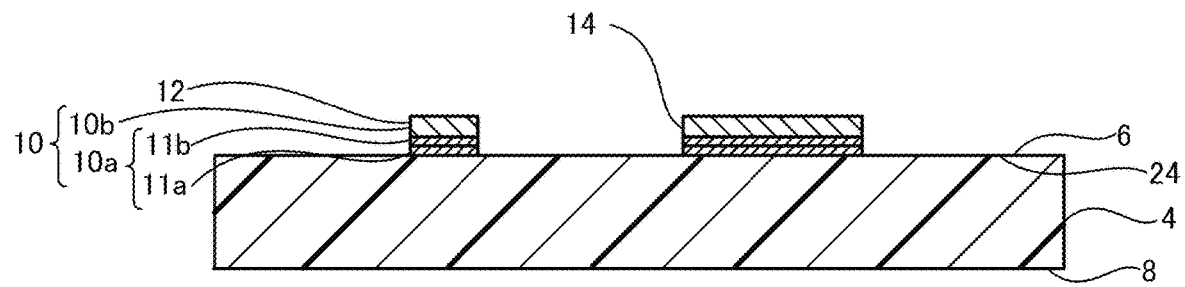
FIG. 3A is a cross-sectional view schematically illustrating a method for manufacturing a printed wiring board according to an embodiment of the present invention.
Figure 3B:
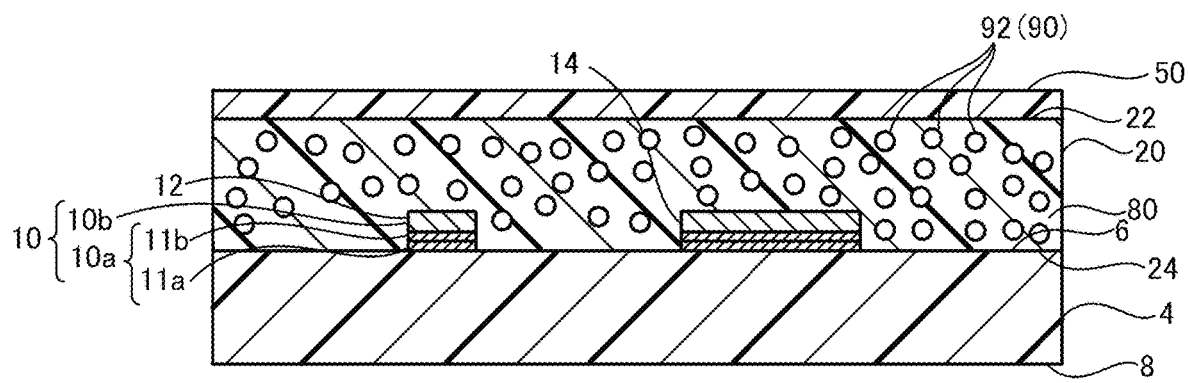
FIG. 3B is a cross-sectional view schematically illustrating a method for manufacturing a printed wiring board according to an embodiment of the present invention.
Figure 3C:
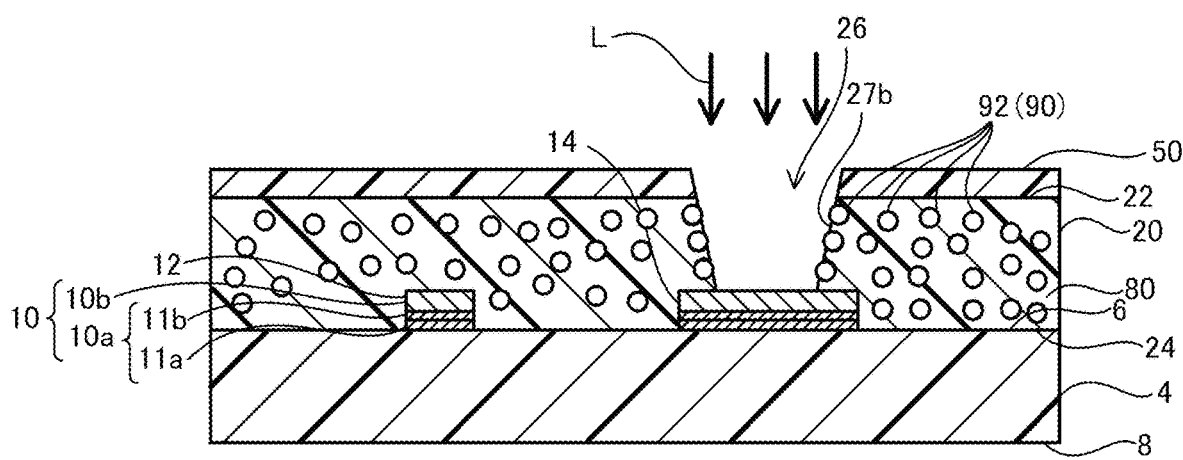
FIG. 3C is a cross-sectional view schematically illustrating a method for manufacturing a printed wiring board according to an embodiment of the present invention.
Figure 3D:
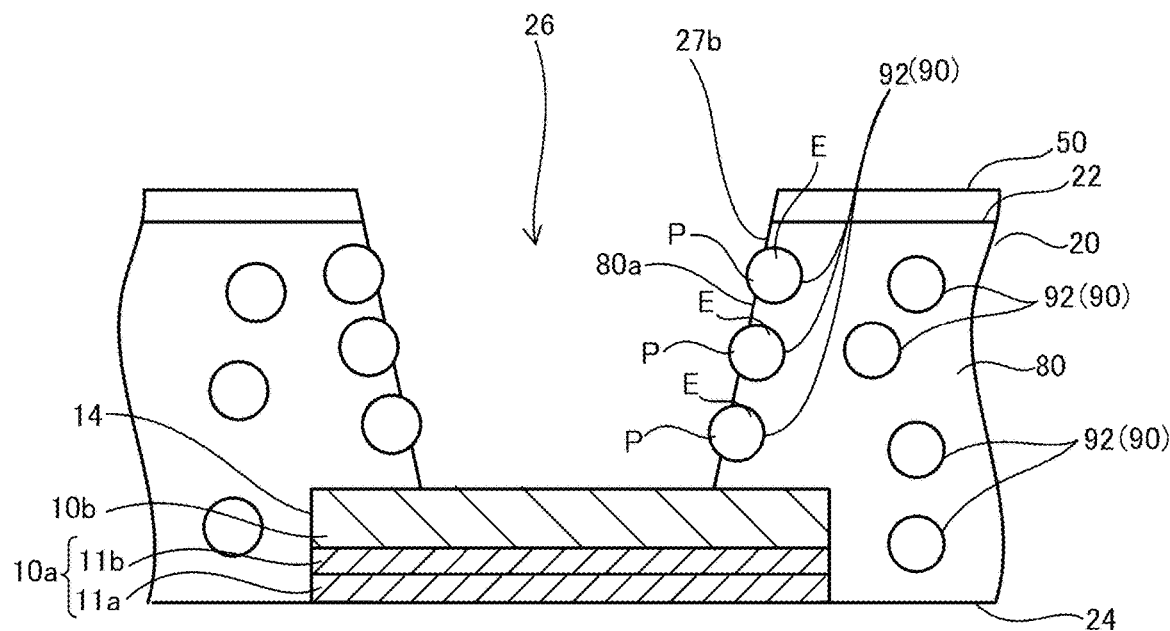
FIG. 3D is an enlarged cross-sectional view schematically illustrating a method for manufacturing a printed wiring board according to an embodiment of the present invention.

FIGS. 3A-3F illustrate a method for manufacturing the printed wiring board 2 according to an embodiment of the present invention. FIGS. 3A-3C and 3E-3F are cross-sectional views. FIG. 3D is an enlarged cross-sectional view. FIG. 3A illustrates the insulating layer 4 and the first conductor layer 10 formed on the third surface 6 of the insulating layer 4. The first conductor layer 10 is formed using a semi-additive method. The first layer (11a) and second layer (11b) are formed by sputtering. The electrolytic plating layer (10b) is formed by electrolytic plating.

As illustrated in FIG. 3B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 3C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 3D illustrates an inner wall surface (27b) of the opening 26 after the laser irradiation. The inner wall surface (27b) is formed of the resin 80 and the inorganic particles 90 protruding from the resin 80. In order to control the shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the first inorganic particles 91 having the flat parts (91a) (see FIG. 2) are obtained. By controlling conditions for treating the inner wall surface (27b) after the laser irradiation, a shape of the inner wall surface (27b) is controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 2) of the embodiment. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and exposed surfaces (91b) of the flat parts (91a) and the surface (80a) of the resin 80 are substantially positioned on the same flat surface. For example, when the seed layer (30a) is formed on the inner wall surface (27b) by sputtering, the protruding portions (P) inhibit growth of a sputtering film. For example, a continuous seed layer (30a) is not formed on the inner wall surface (27b). Or, the seed layer (30a) has to be increased in thickness. A fine conductor circuit cannot be formed. In the embodiment, the projecting portions (P) are removed. The seed layer (30a) formed by sputtering is reduced in thickness. Even when the seed layer (30a) formed by sputtering is thin, a continuous seed layer (30a) is obtained.

Forming the opening 26 includes forming the inorganic particles 90 (the second inorganic particles 92) having the protruding portions (P). The protruding portions (P) protrude from the resin 80 forming the inner wall surface 27 of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

No unevenness is formed on the inner wall surface 27. The inner wall surface 27 is formed smooth. By controlling the conditions for treating the inner wall surface (27b) after the laser irradiation, a size of unevenness is controlled.

Inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. The cleaning includes a desmear treatment. The first surface 22 of the resin insulating layer 20 is covered by the protective film 50, and thus, is not affected by the plasma. No unevenness is formed on the first surface 22 of the resin insulating layer 20. The first surface 22 is not roughened.

When treating the inner wall surface (27b) after the laser irradiation includes cleaning the inside of the opening 26, cleaning the inside of the opening 26 can be omitted.

Figure 3E:
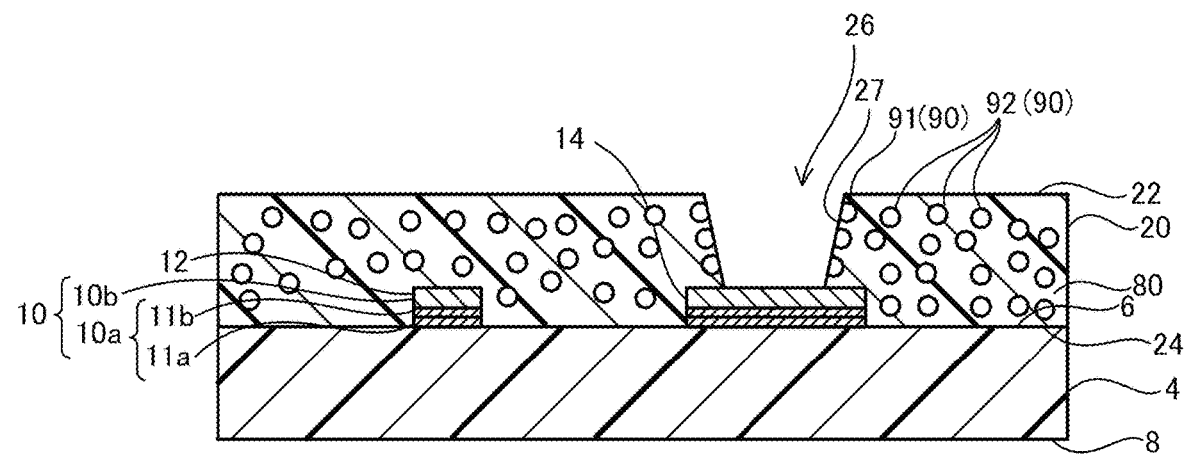
FIG. 3E is a cross-sectional view schematically illustrating a method for manufacturing a printed wiring board according to an embodiment of the present invention.

As illustrated in FIG. 3E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20. After the protective film 50 is removed, the first surface 22 of the resin insulating layer 20 is not roughened.

Figure 3F:
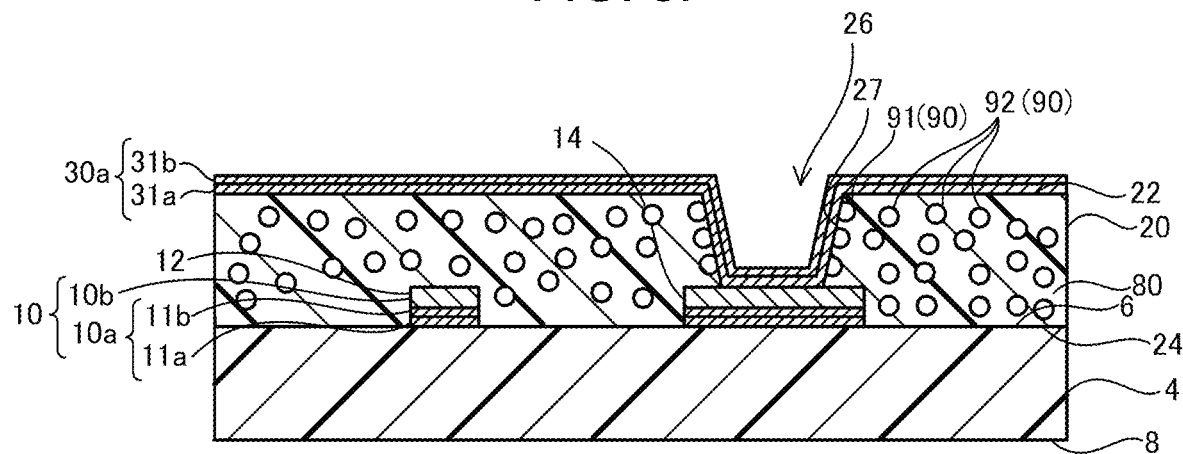
FIG. 3F is a cross-sectional view schematically illustrating a method for manufacturing a printed wiring board according to an embodiment of the present invention.

As illustrated in FIG. 3F, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22 by sputtering. At the same time, the first layer (31a) is formed on the inner wall surface 27 and the pad 14, which are exposed from the opening 26, by sputtering. After that, the second layer (31b) is formed on the first layer (31a) by sputtering. The seed layer (30a) is also formed on the upper surface of the pad 14 exposed from the opening 26 and on the inner wall surface 27 of the opening 26. The first layer (31a) is formed of a copper alloy. The second layer (31b) is formed of copper.

A plating resist (not illustrated in the drawings) is formed on the seed layer (30a). The plating resist has openings for forming the first signal wiring 32, the second signal wiring 34, and the land 36 (FIG. 1).

The electrolytic plating layer (30b) is formed on the seed layer (30a) exposed from the plating resist. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

The plating resist is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

In the printed wiring board 2 (FIGS. 1 and 2) of the embodiment, the inner wall surface 27 of the opening 26 is formed by the flat parts (91a) of the first inorganic particles 91 and the resin 80. The flat parts (91a) and the surface (80a) of the resin 80 that forms the inner wall surface 27 form a substantially common surface. The inner wall surface 27 is formed smooth. Therefore, the seed layer (30a) having a uniform thickness is formed on the inner wall surface 27 of the opening 26. The seed layer (30a) is formed thin (FIG. 3F). When the seed layer (30a) is removed, an etching amount is small. Therefore, an etching amount of the electrolytic plating layer (30b) is small. The second conductor layer 30 having the first signal wiring 32 and the second signal wiring 34 has widths as designed. A high quality printed wiring board 2 is provided.

In the printed wiring board 2 of the embodiment, the first surface 22 of the resin insulating layer 20 is formed of the resin 80. The inorganic particles 90 are not exposed on the first surface 22. No unevenness is formed on the first surface 22. An increase in standard deviation of the relative permittivity in a portion near the first surface 22 of the resin insulating layer 20 is suppressed. The relative permittivity of the first surface 22 does not greatly vary depending on a location. Even when the first signal wiring 32 and the second signal wiring 34 are in contact with the first surface 22, a difference in propagation speed of an electric signal between the first signal wiring 32 and the second signal wiring 34 is reduced. Therefore, in the printed wiring board of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC is suppressed. Even when a length of the first signal wiring 32 and a length of the second signal wiring 34 are 5 mm or more, a difference in propagation speed between the two is reduced. Even when the length of the first signal wiring 32 and the length of the second signal wiring 34 are 10 mm or more and 20 mm or less, malfunction of the logic IC is suppressed. A high quality printed wiring board 2 is provided.

Other Examples

Figure 4:
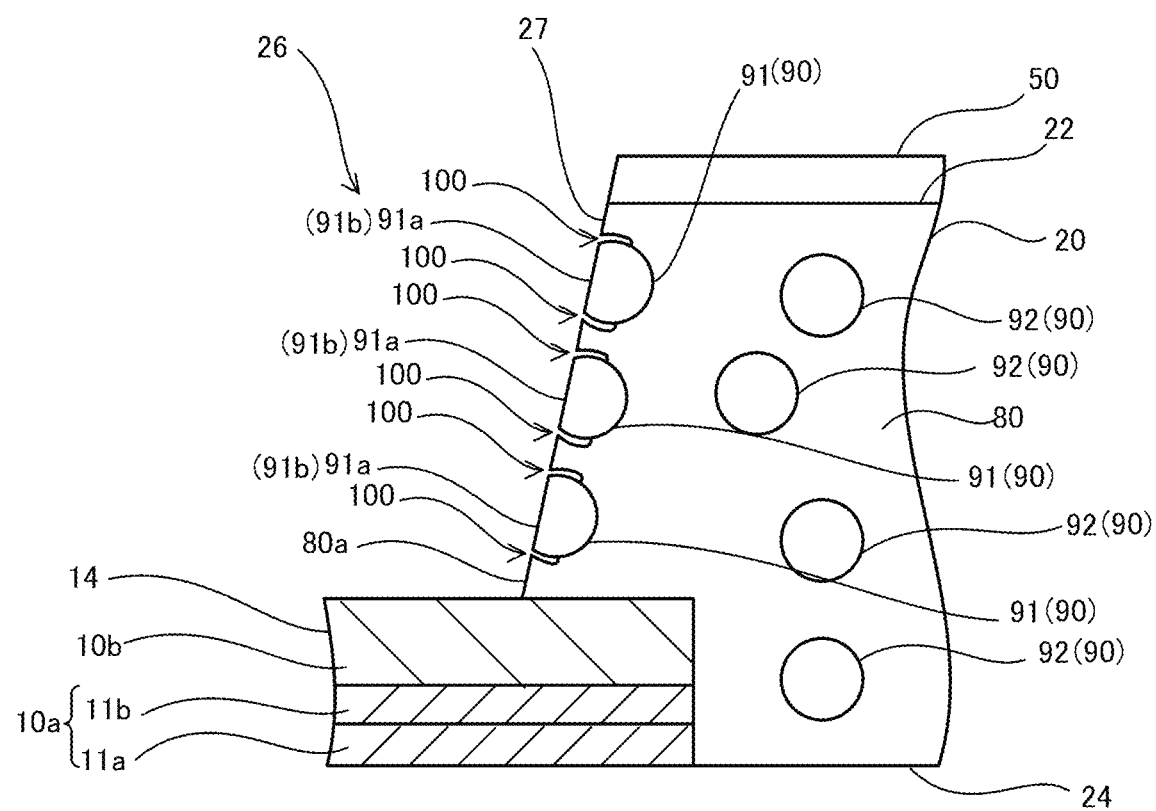
FIG. 4 is an enlarged cross-sectional view schematically illustrating a method for manufacturing a printed wiring board of another example a printed wiring board according to an embodiment of the present invention.

In another example of a printed wiring board according to an embodiment of the present invention, the conditions for treating the inner wall surface (27b) after the laser irradiation are controlled. Therefore, as illustrated in FIG. 4, the flat parts (91a) and the surface (80a) of the resin 80 that forms the inner wall surface 27 form substantially the same flat surface. FIG. 4 is an enlarged cross-sectional view illustrating the inner wall surface 27 after the treatment. A distance between the exposed surface (91b) of each of the flat parts (91a) and the surface (80a) of the resin 80 is 5 μm or less. Therefore, even when there are gaps 100 between the first inorganic particles 91 and the resin 80 formed around the first inorganic particles 91, the seed layer (30a) is formed in the gaps 100. In this case, the seed layer (30a) is formed on the inner wall surface 27 and in the gaps 100. When distances between the exposed surfaces (91b) of the flat parts (91a) and bottoms of the gaps 100 are 5 μm or less, the seed layer (30a) formed by sputtering is less likely to separate from the inner wall surface 27. The distance between the exposed surface (91b) of each of the flat parts (91a) and the surface (80a) of the resin 80 is preferably 3 μm or less. The distances between the flat parts (91a) and the bottoms of the gaps 100 are preferably 3 μm or less. Variation in the thickness of the seed layer (30a) on the inner wall surface 27 is reduced.

In the present specification, the term "flat surface" is used with respect to the shape of the inner wall surface 27, the shapes of the flat parts (91a), and the shapes of the first inorganic particles 91. The meaning of the "flat surface" used with respect to these is illustrated in FIGS. 1 and 2. That is, in FIGS. 1 and 2, the inner wall surface 27 is drawn substantially straight. The shape of the inner wall surface 27 in FIGS. 1 and 2 is substantially a straight line. The term "flat surface" in the present specification includes a substantially straight line illustrated in a cross section. As illustrated in the cross sections of the first inorganic particles 91 in FIGS. 1 and 2, in a cross section, cutting along a flat surface includes cutting along a straight line. The term "flat surface" in the present specification does not mean a perfect flat surface, but includes a substantial flat surface. A substantially flat surface may include small unevenness.

Japanese Patent Application Laid-Open Publication No. 2015-126103 describes a printed wiring board having a first conductor layer, an insulating layer formed on the first conductor layer, and a second conductor layer formed on the insulating layer. The insulating layer has a through hole for a via conductor exposing the first conductor layer. A via conductor connecting the first conductor layer and the second conductor layer is formed in the through hole. The via conductor is formed of an electroless plating layer and an electrolytic plating layer. The insulating layer contains a resin and inorganic particles.

As illustrated in FIG. 17 of Japanese Patent Application Laid-Open Publication No. 2015-126103, in Japanese Patent Application Laid-Open Publication No. 2015-126103, an intermediate layer is provided on a wall surface (inner peripheral surface) of the through hole. The intermediate layer has a complex uneven surface due to gaps formed between the inorganic particles. The inorganic particles contained in the intermediate layer are the same as the inorganic particles contained in the insulating layer. As illustrated in FIG. 18 of Japanese Patent Application Laid-Open Publication No. 2015-126103, in Japanese Patent Application Laid-Open Publication No. 2015-126103, an electroless plating film is formed in the through hole. The electroless plating film follows the unevenness formed in the intermediate layer. Or, the gaps formed in the intermediate layer are filled with the electroless plating film. However, when the unevenness is complex, it is thought to be difficult to completely fill the gaps with the electroless plating film. When the electroless plating film is deposited, it is thought that a gas generated by a reaction inhibits the filling of the gaps. When the gaps are not completely filled with the electroless plated film, it is thought that voids are generated between the wall surface of the through hole and the electroless plated film. When the voids expand due to heat, it is thought that the electroless plated film is peeled off from the wall surface of the through hole.

A printed wiring board according to an embodiment of the present invention includes: a first conductor layer; a resin insulating layer that is formed on the first conductor layer and has an opening for a via conductor exposing the first conductor layer; a second conductor layer that is formed on the resin insulating layer; and a via conductor that is formed in the opening and connects the first conductor layer and the second conductor layer. The second conductor layer and the via conductor are formed of a seed layer and an electrolytic plating layer on the seed layer. The resin insulating layer is formed of inorganic particles and a resin. The inorganic particles include first inorganic particles forming an inner wall surface of the opening and second inorganic particles embedded in the resin insulating layer. Shapes of the first inorganic particles are different from shapes of the second inorganic particles.

In a printed wiring board according to an embodiment of the present invention, the first inorganic particles form the inner wall surface of the opening. The shapes of the first inorganic particles are different from the shapes of the second inorganic particles embedded in the resin insulating layer. For example, the shape of the inner wall is controlled by changing the shapes of the first inorganic particles. The inner wall surface is a surface in contact with the via conductor. Therefore, by controlling the shape of the inner wall surface, adhesion between the via conductor and the resin insulating layer is increased. When the via conductor includes the seed layer, the seed layer is formed on the inner wall surface. Therefore, by controlling the shape of the inner wall, a thickness of the seed layer is reduced. Variation in the thickness of the seed layer is reduced. Widths of conductor circuits in the second conductor layer are close to target values.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer;
a second conductor layer formed on the resin insulating layer; and
a via conductor formed in the resin insulating layer such that the via conductor is connecting the first conductor layer and the second conductor layer,
wherein the resin insulating layer has an opening exposing a portion of the first conductor layer such that the via conductor is formed in the opening, the second conductor layer and the via conductor are formed such that the second conductor layer and the via conductor include a seed layer and an electrolytic plating layer formed on the seed layer, and the resin insulating layer includes a resin material and inorganic particles dispersed in the resin material such that the inorganic particles include first inorganic particles forming an inner wall surface in the opening and second inorganic particles embedded in the resin insulating layer and that the first inorganic particles have shapes that are different from shapes of the second inorganic particles.

2. The printed wiring board according to claim 1, wherein the inner wall surface in the opening includes the first inorganic particles and the resin material such that the first inorganic particles have flat parts forming the inner wall surface in the opening.

3. The printed wiring board according to claim 2, wherein the resin insulating layer is formed such that the inner wall surface is consisting of the resin material and the flat parts.

4. The printed wiring board according to claim 3, wherein the resin insulating layer is formed such that the flat parts and a surface of the resin material forming the inner wall surface form substantially a common surface.

5. The printed wiring board according to claim 2, wherein the resin insulating layer is formed such that each of the second inorganic particles has a spherical shape.

6. The printed wiring board according to claim 5, wherein the resin insulating layer is formed such that each of the first inorganic particles has a shape obtained by cutting one of the second inorganic particles to form a flat surface.

7. The printed wiring board according to claim 2, wherein the resin insulating layer is formed such that each of the first inorganic particles has a shape obtained by cutting a sphere to form a flat surface.

8. The printed wiring board according to claim 2, wherein the resin insulating layer is formed such that the inner wall surface in the opening has an arithmetic mean roughness of 1.0 μm or less.

9. The printed wiring board according to claim 8, wherein the resin insulating layer is formed such that the inner wall surface is consisting of the resin material and the flat parts.

10. The printed wiring board according to claim 2, wherein the resin insulating layer is formed such that an angle between an upper surface of the first conductor layer and the inner wall surface is in a range of 70 degrees to 85 degrees.

11. The printed wiring board according to claim 2, wherein the resin insulating layer is formed such that an angle between an upper surface of the resin insulating layer and the inner wall surface is in a range of 95 degrees to 110 degrees.

12. The printed wiring board according to claim 1, wherein the resin insulating layer is formed such that the inner wall surface in the opening has an arithmetic mean roughness of 1.0 μm or less.

13. The printed wiring board according to claim 1, wherein the resin insulating layer is formed such that an angle between an upper surface of the first conductor layer and the inner wall surface is in a range of 70 degrees to 85 degrees.

14. The printed wiring board according to claim 1, wherein the resin insulating layer is formed such that an angle between an upper surface of the resin insulating layer and the inner wall surface is in a range of 95 degrees to 110 degrees.

15. The printed wiring board according to claim 1, wherein the resin material is a thermosetting resin.

16. The printed wiring board according to claim 1, wherein the resin material is a photocurable resin.

17. The printed wiring board according to claim 1, wherein the seed layer includes a first layer comprising a copper alloy and a second layer comprising copper on the first layer.

18. A method of manufacturing a printed wiring board, comprising:

forming a resin insulating layer on a first conductor layer;

forming a second conductor layer on the resin insulating layer; and forming a via conductor in the resin insulating layer such that the via conductor is connecting the first conductor layer and the second conductor layer, wherein the forming of the via conductor includes forming an opening in the resin insulating layer such that the opening exposes a portion of the first conductor layer and forming the via conductor the opening, the forming of the second conductor layer and the forming of the via conductor includes forming a seed layer and forming an electrolytic plating layer on the seed layer such that the second conductor layer and the via conductor include the seed layer and the electrolytic plating layer on the seed layer, and the forming of the resin insulating layer includes forming the resin insulating layer comprising a resin material and inorganic particles dispersed in the resin material such that the inorganic particles include first inorganic particles forming an inner wall surface in the opening and second inorganic particles embedded in the resin insulating layer and that the first inorganic particles have shapes that are different from shapes of the second inorganic particles.

19. The method of manufacturing a printed wiring board according to claim 18, wherein the forming of the opening includes forming the inorganic particles having protruding portions protruding from the resin material forming the inner wall surface in the opening, and removing the protruding portions of the inorganic particles such that the first inorganic particles are formed.

20. The method of manufacturing a printed wiring board according to claim 18, wherein the forming of the opening includes forming the second inorganic particle having protruding portions protruding from the resin material forming the inner wall surface in the opening, and removing the protruding portions of the second inorganic particles such that the first inorganic particles having exposed surface on the inner wall surface in the opening is formed.

* * * * *